United States Patent
Johnson et al.

(10) Patent No.: US 7,572,693 B2
(45) Date of Patent: Aug. 11, 2009

(54) METHODS FOR TRANSISTOR FORMATION USING SELECTIVE GATE IMPLANTATION

(75) Inventors: F. Scott Johnson, Richardson, TX (US); Tad Grider, McKinney, TX (US); Benjamin P. McKee, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 154 days.

(21) Appl. No.: 11/462,541

(22) Filed: Aug. 4, 2006

(65) Prior Publication Data
US 2006/0270140 A1 Nov. 30, 2006

Related U.S. Application Data

(62) Division of application No. 10/226,536, filed on Aug. 23, 2002, now Pat. No. 7,098,098.

(51) Int. Cl.
*H01L 21/8238* (2006.01)
*H01L 21/336* (2006.01)
*H01L 21/8234* (2006.01)
*H01L 21/04* (2006.01)

(52) U.S. Cl. .................. 438/211; 438/229; 438/257; 438/514; 438/184; 438/142; 438/691; 257/E21.626; 257/E21.64; 257/E21.409

(58) Field of Classification Search .................. 438/211, 438/229, 257, 514, 184, 142, 691; 257/E21.626, 257/E21.64, E21.409
See application file for complete search history.

(56) References Cited

U.S. PATENT DOCUMENTS

| | | | |
|---|---|---|---|
| 5,420,079 | A | 5/1995 | Onishi et al. |
| 5,731,239 | A | 3/1998 | Wong et al. |
| 5,837,572 | A | 11/1998 | Gardner et al. |
| 5,960,270 | A | 9/1999 | Misra et al. |
| 5,966,605 | A | 10/1999 | Ishida |
| 6,423,600 | B1 | 7/2002 | Wu et al. |
| 6,495,437 | B1 | 12/2002 | Yu |
| 6,524,920 | B1 | 2/2003 | Yu |
| 6,559,051 | B1 | 5/2003 | Buynoski et al. |
| 6,582,995 | B2 | 6/2003 | Hsieh et al. |
| 6,784,078 | B2 | 8/2004 | Kasuya |

*Primary Examiner*—Luan C Thai
(74) *Attorney, Agent, or Firm*—Jacqueline J. Garner; Wade J. Brady, III; Frederick J. Telecky, Jr.

(57) ABSTRACT

Methods are disclosed for semiconductor device fabrication in which dopants are selectively implanted into transistor gate structures to counteract or compensate for dopant depletion during subsequent fabrication processing. A patterned implant mask is formed over a semiconductor device, which exposes at least a portion of the gate structure and covers the remaining upper surfaces of the device. Thereafter, dopants are selectively implanted in to the exposed gate structure.

17 Claims, 10 Drawing Sheets

METHODS FOR TRANSISTOR FORMATION USING SELECTIVE GATE IMPLANTATION

RELATED APPLICATION

This is a divisional application of Ser. No. 10/226,536 filed Aug. 23, 2002.

This application is a Continuation-in-Part of Ser. No. 10/123,686, filed Apr. 16, 2002, which is entitled "METHODS FOR TRANSISTOR GATE FORMATION USING GATE SIDEWALL IMPLANTATION".

FIELD OF INVENTION

The present invention relates generally to semiconductor devices and more particularly to methods for doping transistor gates in the manufacture of semiconductor devices.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a doped polysilicon gate is energized to create an electric field within a semiconductor channel underlying the gate, by which current is allowed to conduct between doped source/drain regions formed in a substrate on either side of the channel. In order to provide a conductive gate electrode, a polysilicon gate structure is patterned over the prospective channel region of the substrate and dopants are added to render the polysilicon conductive. The doping of the polysilicon gate structure is usually performed simultaneously with the doping of the source/drain regions of the substrate, typically through implantation processing. The doped polysilicon gate structure overlies a thin gate dielectric layer formed over the channel substrate.

The gate dielectric is an insulator material, which prevents large currents from flowing from the gate into the channel when a voltage is applied to the gate contact, while allowing such an applied gate voltage to set up an electric field in the channel region in a controllable manner. In operation, the resistivity of the channel may be controlled by the voltage applied to the doped gate structure, by which changing the gate voltage changes the amount of current through the channel. The doped polysilicon gate structure and the channel are separated by the gate dielectric, which is an insulator. Thus, little or no current flows between the gate and the channel. However, the gate dielectric allows the gate voltage to induce an electric field in channel, by which the channel resistance can be controlled by the applied gate voltage.

In the manufacture of such devices, there is a continuing trend toward higher device densities, and hence smaller and smaller device dimensions. Generally, device density is improved by scaling or decreasing the size of the transistors and other electrical components. In this continuing process, it is desirable to provide sufficient polysilicon doping to accommodate the smaller device sizes. In addition, although generally scaled to be smaller, certain devices require larger feature sizes than others, including gate dimensions. Typically, the doping of the polysilicon gate structures is performed in a single implantation step across all the polysilicon gate structures in a semiconductor device.

After the polysilicon is doped, subsequent processing of the semiconductor device may lead to a depletion of dopants in selected regions of the polysilicon ("dopant depletion"). This is typically due to out-diffusion of the dopants into either the ambient or surrounding films during high processing at elevated temperatures. This loss of dopants is proportional to the polysilicon surface area and results in a reduction in the average doping at the polysilicon-gate dielectric interface at the completion of the processing. This condition, referred to as "poly depletion", causes an increase in the region of polysilicon that is depleted of carriers when the gate is biased to allow accumulation in the MOS channels. The increase in the effective thickness of the gate oxide under the inversion condition has the effect of an increase in threshold voltage and reduction in gate capacitance, in turn causing a reduction in transistor drive current and increased logic gate delay and processing time.

In order to provide process uniformity and control over individual device performance, it is desirable to ensure that the dopant concentrations in all the gate structures be the same in both small and large polysilicon gate structures when the manufacturing process is completed. Accordingly there is a need for processes and methodologies by which poly depletion can be mitigated or controlled in order to reduce the dopant loss and to improve uniformity for end-of-process poly gate dopant concentration across devices having different gate dimensions.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for fabricating semiconductor devices directed to mitigating the adverse effects of gate dopant depletion. Toward that end, the invention provides extra dopants to gate structures, which may be employed to counteract or compensate for dopant depletion in subsequent fabrication processing of the wafer.

One aspect of the invention provides methods for fabricating semiconductor devices and transistor gate structures therefor, wherein a selective implantation is performed to provide dopants into the gate structure, with one or more separate implantation steps used to dope transistor source/drain regions of the substrate. The selective gate implantation may be performed at any point in the fabrication process following gate structure formation. In one example, the selective gate implant is performed between an initial (shallow) lightly doped drain (LDD) implantation and a subsequent (deeper) source/drain implantation. However, the ordering of the LDD and source/drain implantation steps may be reversed in accordance with the invention, with appropriate sidewall spacers employed as needed.

The selective implantation of the invention may be employed to provide enough doping so that poly depletion is minimized or mitigated for all layout variations. This may provide several advantages in the manufacture of semiconductor products, for example, those having various transistors of different sizes. In such a situation, poly depletion differences for transistors of different lengths and/or widths are no longer significant, due to the fact that poly depletion is much less of an issue overall. Another advantage is that the reduced poly depletion increases gate capacitance and therefore increases transistor drive current at a given off state leakage current. Thus, the various aspects of the invention may be employed to provide one or more advantages over existing techniques in the manufacture of semiconductor devices.

In one implementation of the invention, the selective gate implantation involves formation of a patterned implant mask over the semiconductor device, which exposes at least a portion of the gate structure and covers the remaining upper surfaces of the device. Thereafter, dopants are selectively implanted into the exposed gate structure. The implantation mask may be formed of any appropriate material, using a variety of masking techniques, such as by depositing a film over the semiconductor device and removing a portion of the film over the gate structure to expose a portion thereof before the selective implantation.

In one example illustrated and described below, a substantially conformal film, such as an oxide, is formed over the semiconductor device. The wafer is then planarized, such as using chemical mechanical polishing (CMP) to expose a portion of the gate structure, and the selective implantation is performed using the patterned oxide film as an implant mask. In another example, a substantially non-conformal spin-on or resist material is formed over the device, which may be etched to expose the gate structure, for instance, using a reactive ion etch process. Depending on the non-conformal nature of the film, no film may need to be removed between film formation and the selective gate implantation. The selective gate implantation thus provides extra dopants to the gate structure without significantly doping the source/drain regions of the substrate. Thereafter, the implantation mask may be removed, such as by wet or dry etching, for further processing of the wafer. The invention thus facilitates precise control over the doping concentrations and uniformity of both the source/drain regions of the substrate, as well as of the gate structure, allowing compensation for process related dopant depletion from the gate.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. Referring initially to FIGS. 1A-1D, a high degree of poly depletion occurs when an insufficient amount of dopant is introduced to the poly gate region nearest the gate oxide. This can be due to an insufficient amount of dopants being introduced to the polysilicon, or to the anneal subsequent to the doping of a poly gate being insufficient to drive the implanted impurities down the entire depth of the poly gate. Because the amount of dopant and the degree of annealing can be limited by other practical manufacturing considerations, such as dopant diffusion in other regions of the transistor structure, most often both of these factors contribute significantly.

Consequently, a portion of the poly gate nearest the underlying gate oxide is depleted of carriers and behaves as an insulating region. As a result, the transistor behaves as though the gate oxide is substantially thicker, leading to lower drive current capability and higher threshold voltages for the devices. The inventors have appreciated that depletion of P-type or N-type dopants from polysilicon gate structures may be aggravated by reduction in the length or width of such structures through edge induced dopant loss. In this regard, as gate lengths and widths decrease, a larger percentage of the polysilicon gate volume is proximate the edges, whereby such edge induced dopant losses become more and more significant to the final device performance.

Figure 1A:
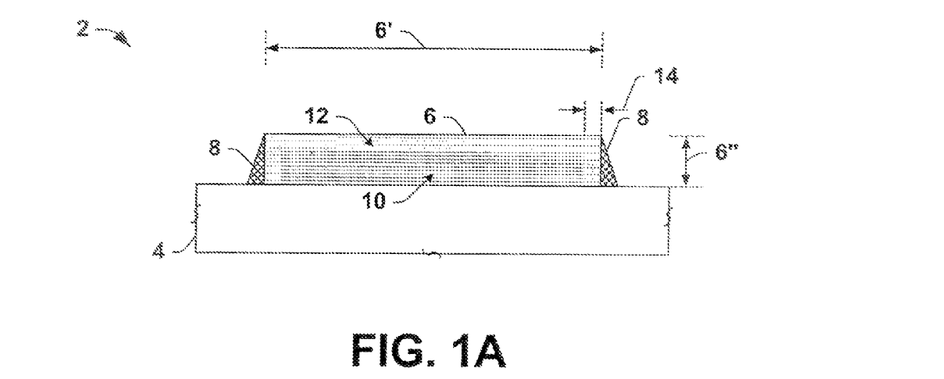
FIG. 1A is a partial side elevation view in section illustrating a relatively long polysilicon gate structure at an intermediate stage in the fabrication of a semiconductor device, wherein dopant concentration has been depleted proximate the sidewalls.
Figure 1B:
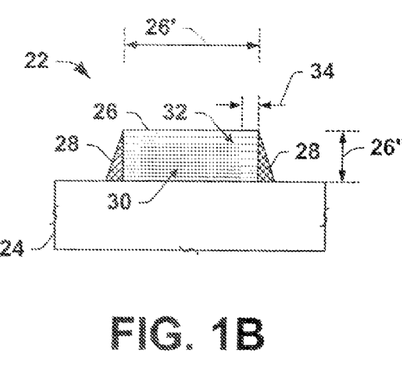
FIG. 1B is a partial side elevation view in section illustrating an intermediate length polysilicon gate structure, wherein dopant concentration has been depleted proximate the sidewalls, resulting in overall depletion of a greater percentage of dopants than in the structure of FIG. 1A.
Figure 1C:
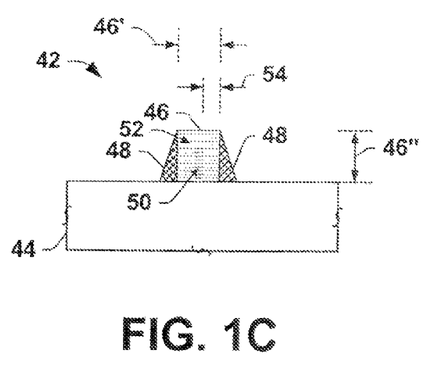
FIG. 1C is a partial side elevation view in section illustrating a relatively short polysilicon gate structure, wherein dopant concentration has been depleted proximate the sidewalls, resulting in overall depletion of a greater percentage of dopants than in the structures of FIGS. 1A and 1B.

As an illustration, FIGS. 1A-1C show polysilicon gate structures having successively shorter lengths, at an intermediate stage of fabrication. In FIG. 1A, a semiconductor device 2 is illustrated wherein a polysilicon gate structure 6 is formed over a substrate 4 having a relatively long length 6' of about 10 μm and a height 6" of about 100 nm. Sidewall spacers 8 are formed adjacent sidewalls of the gate structure 6 in order to protect the underlying channel region of the substrate 4 during implantation of the gate 6 and prospective source/drain regions of the substrate 4. The polysilicon gate 6 is illustrated following implantation of dopants therein and subsequent processing, by which dopants having a relatively high concentration are found in a first region 10, whereas lower dopant concentrations are found in a second region 12 near the top and side edges and extending a distance 14 therefrom in the gate 6. The illustrations herein are not necessarily drawn to scale, and it will be appreciated that although the dopant concentrations in the regions 10 and 12 are illustrated as generally constant, the actual concentrations are likely to be profiled.

The inventors have appreciated that the dopant losses in the region 12 are caused, at least in part, by various processing steps used in fabricating the device 2 following dopant implantation in the gate structure 6, referred to herein as edge induced dopant losses. For example, the inventors have found that growing oxides causes depletion of the poly dopant concentration from the region 12 near the top and sides of the structure 6. It is believed that when the device 2 is placed in an oxidation chamber, dopants are lost to the oxidizing ambient through outgassing from the region 12 prior to formation of oxide. In addition, it is believed that when oxides form on the top and exposed sidewalls of the poly gate structure 6, that further dopant is lost from the region 12 through diffusion thereof into the oxide. Furthermore, the inventors have appreciated that dopants are lost near the edges of the structure 6 during silicidation, where dopants diffuse during annealing into the cobalt, titanium, nickel, or other materials used in such processing.

Referring also to FIG. 1B, another device 22 is illustrated in which a somewhat narrower polysilicon gate structure 26 is formed over a substrate 24 having a length 26' of about 1 μm less than the length 6' of the structure 6 in FIG. 1A, and a height 26" similar to the height 6" (e.g., about 100 nm). Sidewall spacers 28 are formed along the sidewalls of the gate 26, and the gate 26 has been implanted with dopants. Through subsequent processing steps (not shown), the above mentioned and/or other edge induced dopant losses result in dopants having a relatively high concentration being found in a first region 30, with lower concentrations being found in a second region 32 near the top and side edges and extending a distance 34 therefrom in the gate 26. As illustrated, the distance 34 is generally similar to the distance 14 of FIG. 1A, whereby the edge related dopant loss as a percentage of the total volume of the structure 26 is proportionally higher in the relatively narrower gate 26, compared with the long length gate 6 of FIG. 1A. Thus, the inventors have appreciated that such edge induced dopant losses are more detrimental as device sizes (e.g., gate lengths and/or widths) continue to decrease.

In FIG. 1C, another device 42 is illustrated in which an even smaller polysilicon gate structure 46 is formed over a substrate 44 having a length 46' of about 0.1 μm (e.g., less than the lengths 6' and 26' in FIGS. 1A and 1B), and a height 46" of about 100 nm (e.g., similar to the heights 6" and 26"), and with sidewall spacers 48 formed along the gate sidewalls. The gate 46 has been implanted with dopants and subsequently processed whereby edge induced dopant losses have occurred. As a result, a relatively high concentration of dopants are found in a first region 50 and lower concentrations are found in a second region 52 extending a distance 54 from the edges of the gate structure 46. As can be appreciated from FIG. 1C, these edge induced losses have become a significant limitation in the dopant concentration in the final gate structure, due to the scaling of the gate length 46'. It will be further noted from FIGS. 1A-1C, that where devices having different gate lengths are formed on a single device, the edge induced dopant losses will impact the final gate dopant concentrations differently. In this regard, the inventors have appreciated that countermeasures are needed to facilitate control over final gate dopant concentrations, as well as consistency thereof across devices of differing gate dimensions.

Figure 1D:
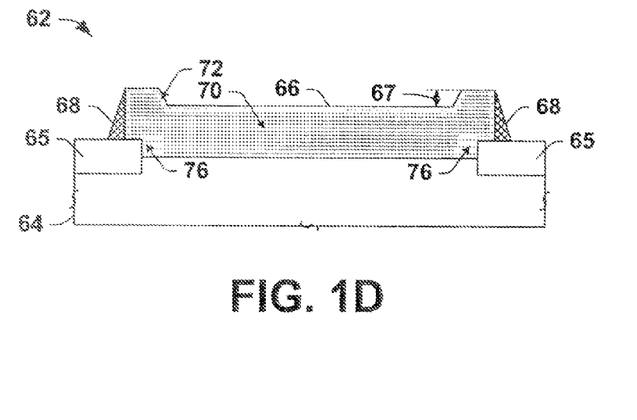
FIG. 1D is a partial side elevation view in section illustrating the width of a polysilicon gate structure extending over topographic isolation structure. In this situation, the higher volume of polysilicon over the isolation topography due to the conformal deposition of polysilicon combined with the perfectly planar nature of the ion implant process that is used to introduce dopant atoms to the top surface of the polysilicon, combine to result in a reduced density of dopant in the volume of polysilicon proximate the isolation structures.

Referring also to FIG. 1D, it has been found that edge induced dopant losses are also found in situations where gate structures are formed over or near topographical features, such as isolations structures. FIG. 1D illustrates a polysilicon gate structure 66 extending over topographic isolation structures 65. In this situation, the higher volume of polysilicon over the isolation topography due to the conformal deposition of polysilicon, combined with the planar nature of the ion implant process that is used to introduce dopant atoms to the top surface of the polysilicon 66, result in a reduced density of dopant in the volume of polysilicon proximate the isolation structures 65.

In FIG. 1D, a semiconductor device 62 is illustrated comprising a polysilicon gate structure 66 formed over a substrate 64, having a gate width extending between and partially overlying two isolation structures 65, with sidewall structures 68 along the endwalls thereof. As discussed above, processing steps following gate dopant implantation result in edge induced dopant losses, by which a relatively high concentration of dopants are found in a first region 70 and lower concentrations are found in a second region 72 extending near the top and endwalls of the gate 66. In addition, the formation of the gate ends over the STI structures 65 results in a step in the gate 66 having a step height 67. The inventors have found that the step caused by the topography in these situations also leads to edge induced dopant losses near the STI structures 65, wherein regions 76 have lower finished product dopant concentrations than are found in the interior region 70.

The above-mentioned edge induced dopant losses contribute to the overall loss of dopant concentrations in finished gate structures. As is known, the dopant loss degrades transistor performance characteristics, such as drive current capabilities, threshold voltages, and the like. Therefore, it is desirable to mitigate the dopant loss or to otherwise compensate for such losses in the fabrication of semiconductor integrated circuits. Furthermore, it is desirable to provide uniformity in the dopant concentrations across devices having different polysilicon gate structure dimensions, such as where some transistors have smaller gates than others in a given device. While attempts have been made at reducing or mitigating the actual losses, the inventors have appreciated that the introduction of additional dopants may be employed as a countermeasure, by which desired end process dopant concentrations can be achieved even where such poly depletion is encountered in processing following initial gate doping.

Figure 2A:
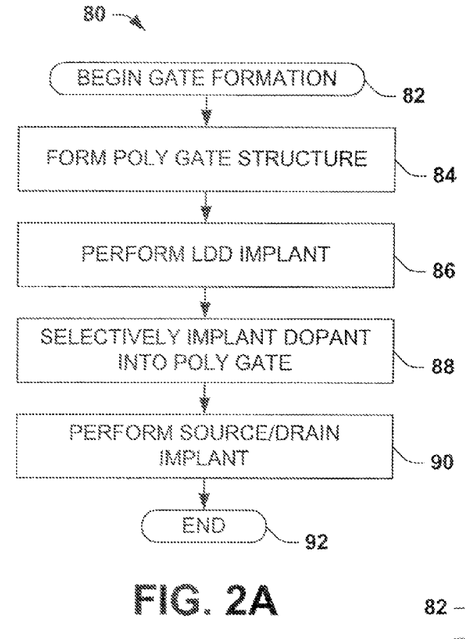
FIG. 2A is a flow diagram illustrating an exemplary method of forming polysilicon gate structures in accordance with the present invention.
Figure 2B:
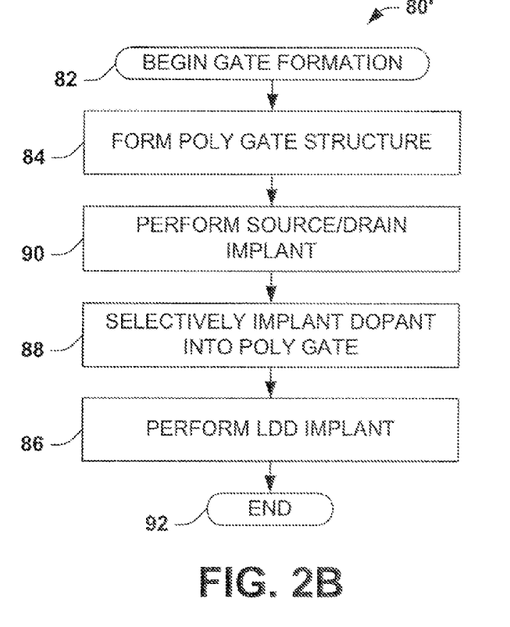
FIG. 2B is a flow diagram illustrating another exemplary method of forming polysilicon gate structures with the ordering of LDD and source/drain implants reversed in accordance with the present invention.

Referring now to FIGS. 2A and 2B, the invention provides selective implantation of dopants into the gate structure, with one or more separate implantation steps used to dope transistor source/drain regions of the substrate. In FIG. 2A, one exemplary method 80 is illustrated in which the selective gate implant is done following an LDD implant and prior to a deeper source/drain implant. An alternative method 80' is illustrated in FIG. 2B, wherein the ordering of the LDD and source/drain implants are reversed. While the methods of 80, 80' and the other exemplary methods illustrated and described herein are presented as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method 80 begins at 82 with a polysilicon gate structure being formed at 84. A lightly doped drain (LDD) implant is performed at 86. Thereafter, the gate structure is selectively implanted with dopants at 88, as illustrated and described in greater detail hereinafter with respect to FIGS. 3-21. At 90, a source/drain implant is performed before the method 80 ends at 92. In the alternate method 80' of FIG. 2B, the source/drain implant 90 is performed prior to the selective gate implantation at 88, after which the LDD implant is done at 86. It is to be appreciated that the source/drain and LDD implants at 90 and 86, respectively, provide dopants to the source/drain regions of the wafer substrate, and may also provide dopants to the gate structures thereof. However, the selective gate structure implantation at 90 may be done so as to provide dopants to the gate structure without significantly doping the source/drain regions.

The present invention may thus be carried out in a semiconductor device fabrication process flow to provide additional dopants to polysilicon or other type gate structures and thereby compensate for or mitigate the adverse effects of gate dopant depletion. As illustrated in FIGS. 1A-1D above, the edge induced dopant losses become more and more significant as device sizes continue to shrink. The inventors have found that the provision of additional dopants to gate structures at 88 may be employed to yield higher and more consistent end-of-process gate dopant concentrations than previously possible using conventional gate doping techniques. This effectively provides additional dopants to compensate for dopant diffusion and/or outgassing losses in subsequent processing of the device.

Figure 3:
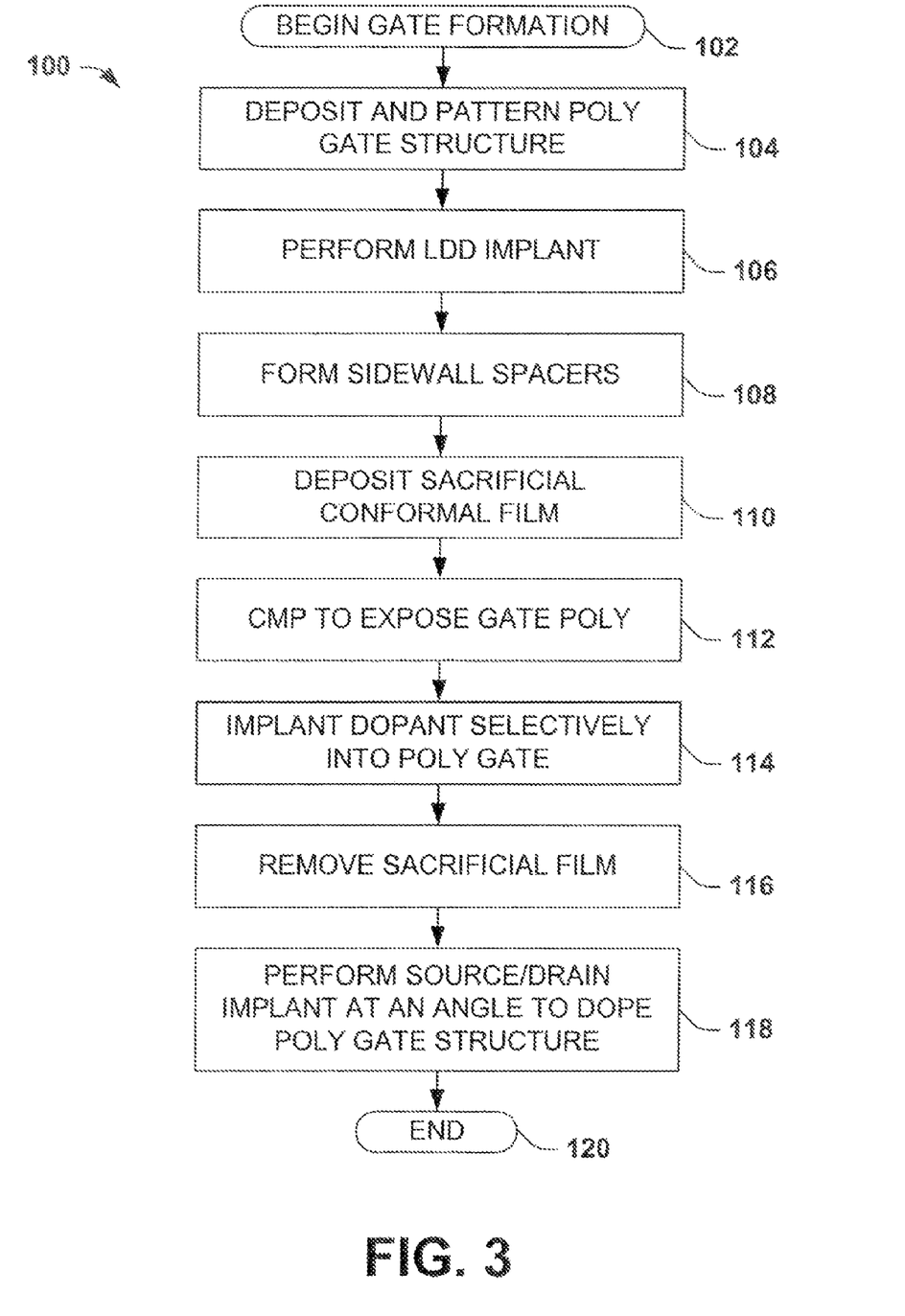
FIG. 3 is a detailed flow diagram illustrating another exemplary method of fabricating semiconductor devices in accordance with the present invention.

Referring now to FIG. 3, one exemplary implementation of the invention is illustrated as a method 100 for forming transistor gates in the fabrication of a semiconductor device. Beginning at 102, the method 100 comprises forming a gate structure at 104 by depositing and patterning a polysilicon layer over a wafer substrate, for example, using known polysilicon deposition techniques and lithography processes. The gate structure formation at 102 may be done following formation of a gate oxide material (not shown) over the substrate surface using known oxidation techniques. At 106 a lightly doped drain (LDD) implantation is performed. The LDD implant at 106 may be used, for example, to implant a shallow portion of the substrate in the source/drain regions using the polysilicon gate structure for self-alignment thereof. In this regard, the implantation at 106 may also provide dopants to the gate structure.

Sidewall spacers are then formed at 108 along the sidewalls of the gate structure using any appropriate process steps as are known. For example, a spacer material may first be deposited at 108, such as oxide or nitride material, and then etched to expose the top of the gate structure and source/drain regions of the substrate using an etch process selective to polysilicon. In accordance with the present invention, a patterned mask is formed at 110 and 112, which exposes at least a portion of a gate structure and which covers the remaining upper surfaces of the semiconductor device, before the gate structure or portions thereof are selectively implanted at 114.

Any type of implantation masking techniques may be employed in accordance with the invention. For example, a film may be deposited over the wafer, either conformally or non-conformally, with a portion thereof being removed over the gate structure to at least partially expose upper surfaces of the gate. Alternatively, where the deposited film is sufficiently non-conformal )e.g., so as to cover the source/drain regions of the device while leaving the gate structure exposed after deposition), the gate implantation may be performed directly following film deposition.

In the exemplary method 100, a substantially conformal film is deposited at 110, followed by a chemical mechanical polishing (CMP) planarization process at 112 to expose at least a portion of the gate polysilicon. The conformal film may be substantially thick, such as about 2 to 3 times the thickness of the gate structure. In one example, the substantially conformal film comprises oxide material deposited over the semiconductor device to a thickness of about 2000 to 3000 Å, using a chemical vapor deposition process. Other materials and deposition methodologies may be employed at 110 to form the film over the device in a substantially conformal manner within the scope of the invention. In addition, other exposure techniques can be employed to expose a portion of the gate structure through the film at 112.

At 114, the remaining portions of the film operate as an implantation mask during selective implantation of dopants into all or some of the gate structure, without significantly implanting the source/drain or other regions of the substrate. Any appropriate implantation dosage, energy, species, etc. may be employed at 114 to provide additional dopants to the gate structures in a generally selective fashion. Thereafter, the sacrificial film is removed at 116 using any appropriate material removal process, such as dry plasma etching (e.g., RIE) or wet etching techniques as are known. A source/drain implant is performed at 118 to provide further dopants to lower parts of the source/drain regions of the substrate, which uses the sidewalls spacers from step 108 to prevent implantation into the channel region beneath the gate structure, after which the method 100 ends at 120.

The source/drain implant at 118 (e.g., and the LDD implant at 106) may also provide dopants to the gate structure. Thereafter an anneal operation (not shown) may be employed to drive implanted dopants further into the wafer substrate, and other processing steps are carried out as are known for interconnecting electrical components in the semiconductor device. As discussed above, although the exemplary method 100 illustrates the LDD implant at 106 being before the selective gate implant at 114 and the source/drain implant being thereafter at 118, the ordering of the LDD and source/drain implants at 106 and 118 may be reversed in accordance with the invention. In addition, the selective gate implantation at 114 and the other implants at 106 and 108 may be performed using any known implantation species such as boron, arsenic, phosphorus or others, so as to render the polysilicon gate structure conductive, using any appropriate implantation equipment. Furthermore, the relative orientation between the ion implanter and the substrate may be controlled in accordance with the invention so as to provide dopants to the gate structure at an angle.

Figure 4:
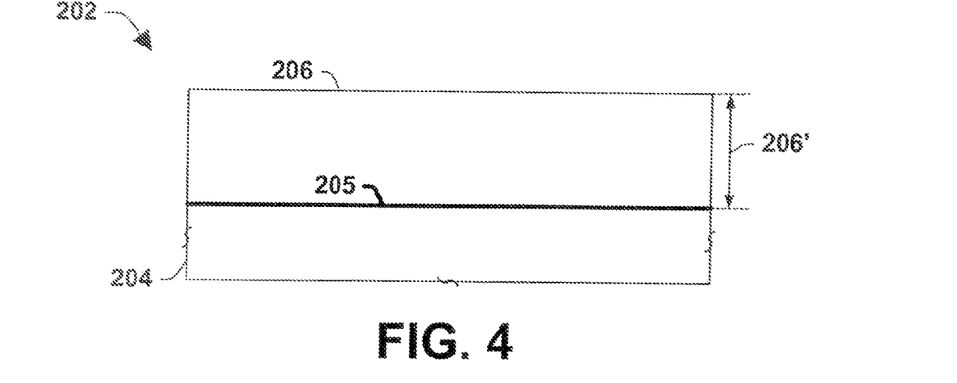
FIG. 4 is a partial side elevation view in section illustrating formation of a polysilicon layer over a substrate during gate fabrication in accordance with one exemplary implementation of the invention.
Figure 5:
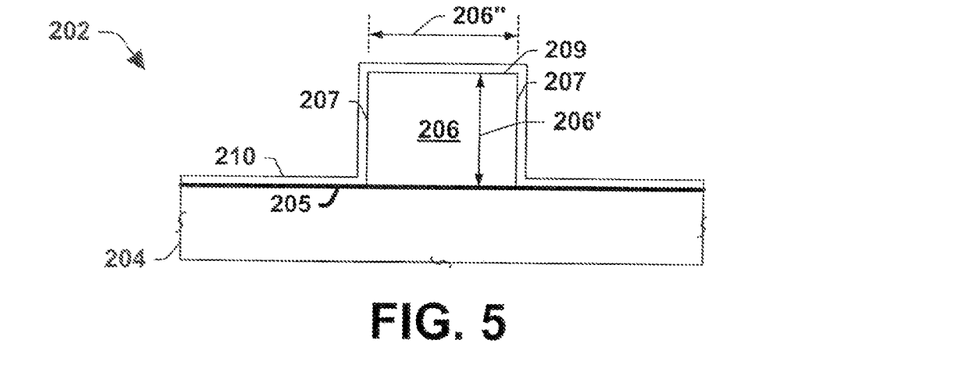
FIG. 5 is a partial side elevation view in section illustrating a patterned polysilicon gate structure in the device of FIG. 3, having an oxide layer formed thereover.

In order to further appreciate the various aspects of the invention, FIGS. 4-14 illustrate an exemplary semiconductor device 202 processed according to one implementation of the invention, wherein the gate implantation mask is formed using a substantially conformal thick sacrificial oxide film with CMP planarization processing. In FIG. 4, a substrate 204 is provided with a thin gate oxide layer 205 grown thereover using known thermal oxidation techniques. A polysilicon material 206 is deposited as a layer over the gate oxide 205 and then patterned using appropriate photolithographic processing techniques (not shown), leaving the patterned polysilicon gate structure 206 of FIG. 5. The gate structure 206 has a height 206' of about 1000 Å and a length 206", with sidewalls 207 and an upper surface or top 209. In the present example, an optional oxide layer 210 is formed over the gate structure 206 and the remainder of the substrate 204 as illustrated in FIG. 5.

Figure 6:
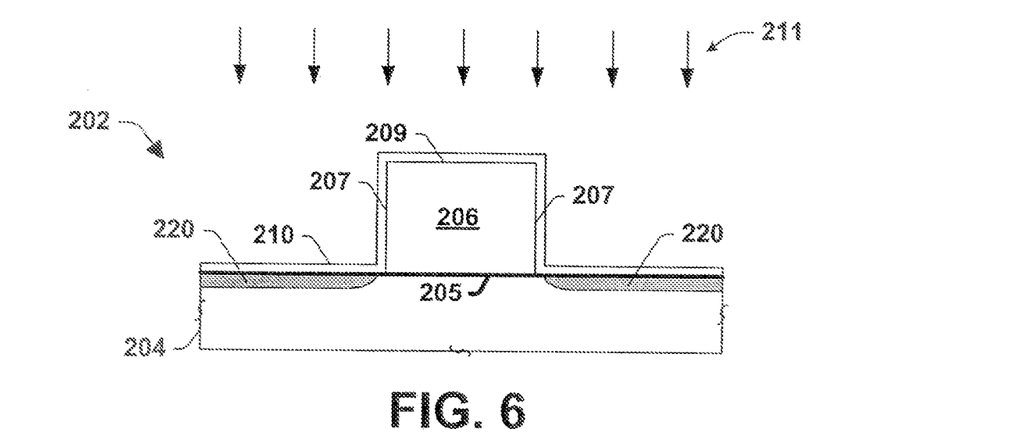
FIG. 6 is a partial side elevation view in section illustrating an LDD implantation into prospective source/drain regions of the device of FIG. 5.
Figure 7:
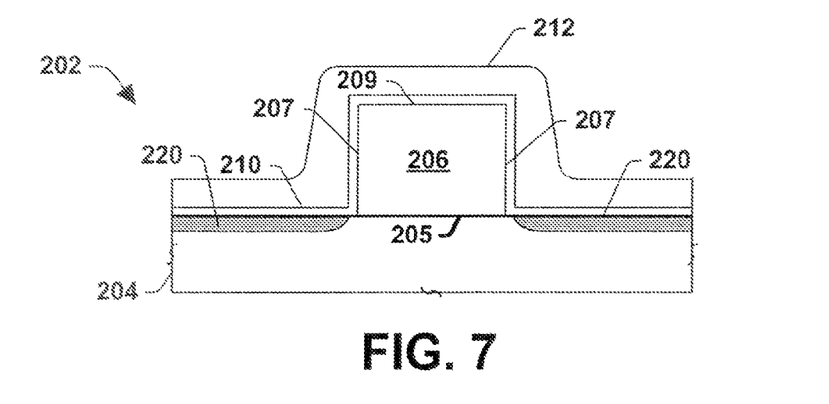
FIG. 7 is a partial side elevation view in section illustrating formation of a nitride spacer material over the patterned polysilicon gate structure of FIG. 6.
Figure 8:
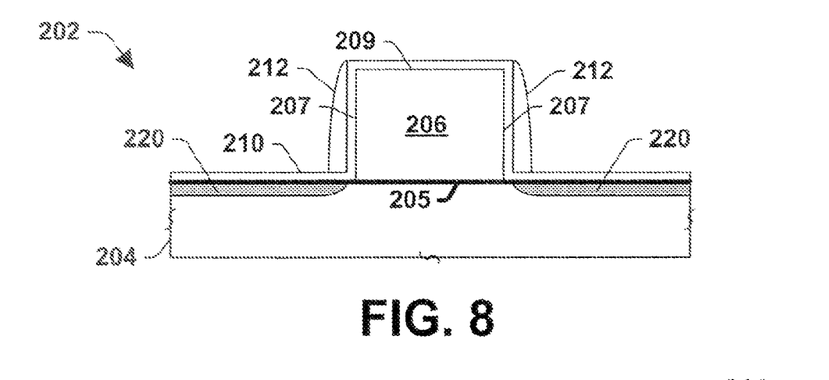
FIG. 8 is a partial side elevation view in section illustrating etching of the spacer material to form sidewall spacers adjacent sidewalls of the polysilicon gate structure.

In FIG. 6, an LDD implantation process 211 is employed to provide dopants in shallow portions 220 of prospective source/drain regions in the substrate 204 on either side of the gate structure 206, using the structure 206 for self-alignment, wherein the LDD implantation 211 may also provide dopants (not shown) to the gate structure 206. In FIG. 7, a nitride spacer material 212, such as $Si_3N_4$, is deposited as a layer. An etch process (not shown) is then employed to selectively remove a portion of the spacer material 212 to expose the upper portion of the gate structure top 209 and the remainder of the spacer layer 210, leaving sidewall spacers 212 as illustrated in FIG. 8. In other implementations, the sidewall spacers 212 may expose upper portions of the gate structure sidewalls 207. It is also noted in FIG. 8 that the nitride etch process exposes a portion of the semiconductor substrate 204 in prospective source/drain regions 220.

Figure 9:
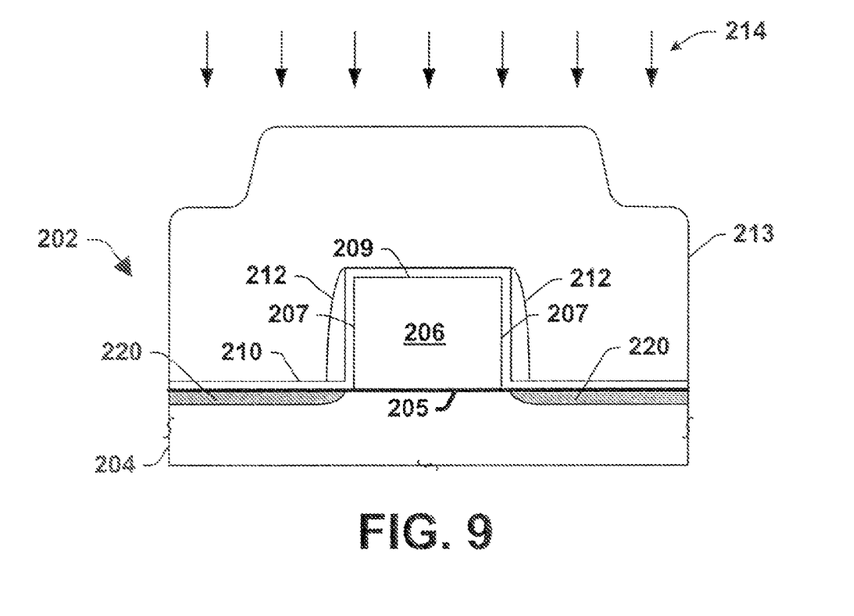
FIG. 9 is a partial side elevation view in section illustrating formation of a thick sacrificial conformal film over the device of FIG. 8.
Figure 10:
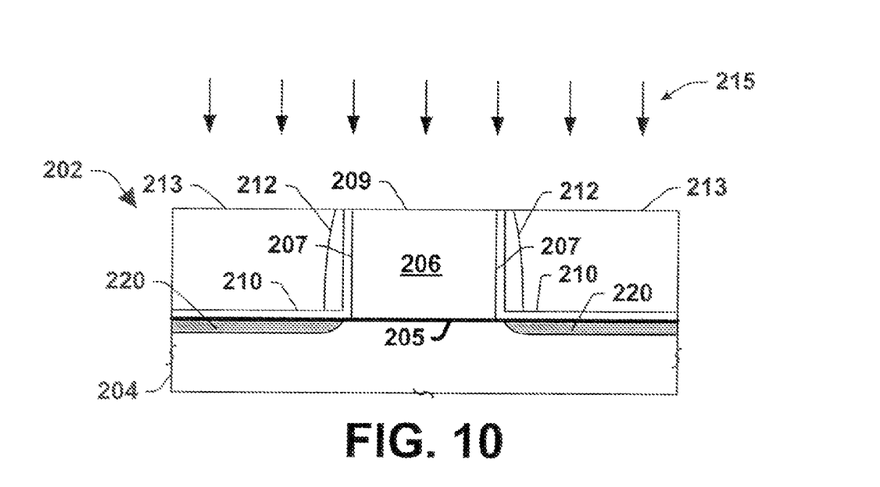
FIG. 10 is a partial side elevation view in section illustrating a chemical mechanical polishing process to expose the upper surface of the polysilicon gate structure.
Figure 11:
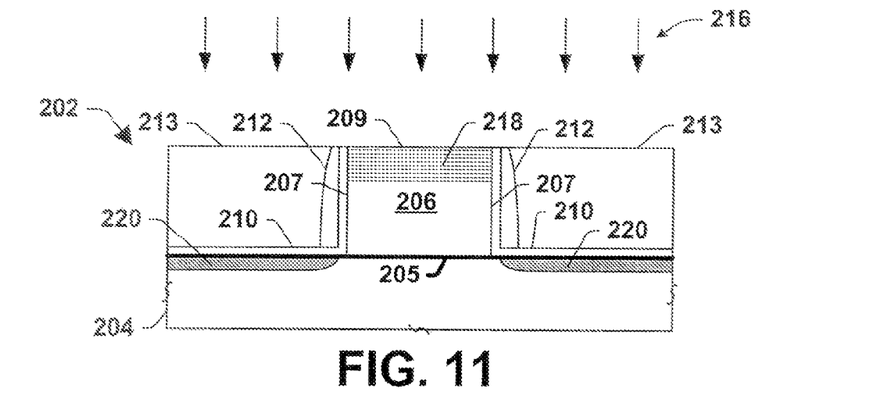
FIG. 11 is a partial side elevation view in section illustrating a selective implantation of dopants into the exposed polysilicon gate structure in accordance with the invention.

Referring now to FIG. 9, in accordance with an aspect of the invention, a thick conformal oxide film 213 is deposited using a chemical vapor deposition (CVD) process 214 to a thickness approximately 2 to 3 times that of the polysilicon gate structure 206, wherein the structure of FIG. 9 and other figures herein are not necessarily drawn to scale. In one example, the film 213 is deposited to a thickness of between about 2000 and 3000 Å. Thereafter in FIG. 10, a CMP planarization process 215 is employed to expose the upper portion 209 of the gate structure 206, leaving a remaining portion of the film 213 as an implantation mask covering the doped source/drain regions of the substrate 204. A cleaning step may optionally be performed (e.g., dry etch or deionized wafer rinse) following the chemical mechanical polishing to remove residue and/or to ensure a clean and uniform implantation surface. In FIG. 11, an implantation process 216 is employed to provide dopants 218 to the upper portion in the gate structure 206, thereby selectively doping the polysilicon gate. These dopants are in addition to any dopants (not shown) provided by the LDD implantation process 211 of FIG. 6 and those of any subsequent source/drain implants, which may serve to compensate for process related gate dopant depletion in the fabrication of the device 202.

Figure 12:
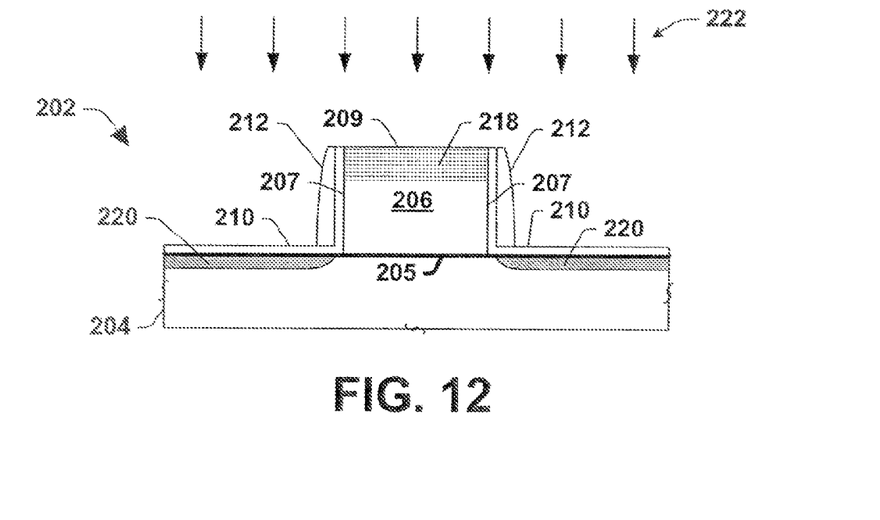
FIG. 12 is a partial side elevation view in section illustrating removal of the remaining sacrificial film from the device of FIG. 11.
Figure 13:
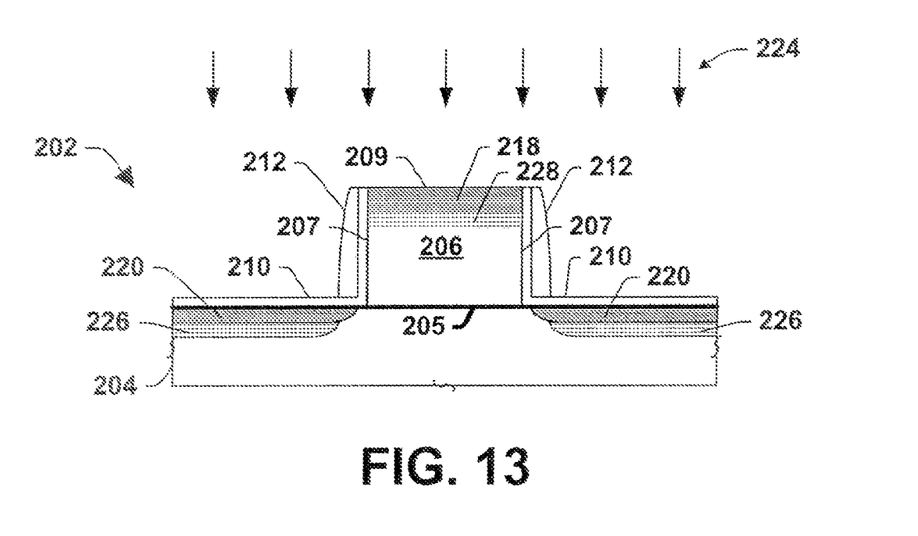
FIG. 13 is a partial side elevation view in section illustrating a source/drain implantation in the device of FIG. 12.
Figure 14:
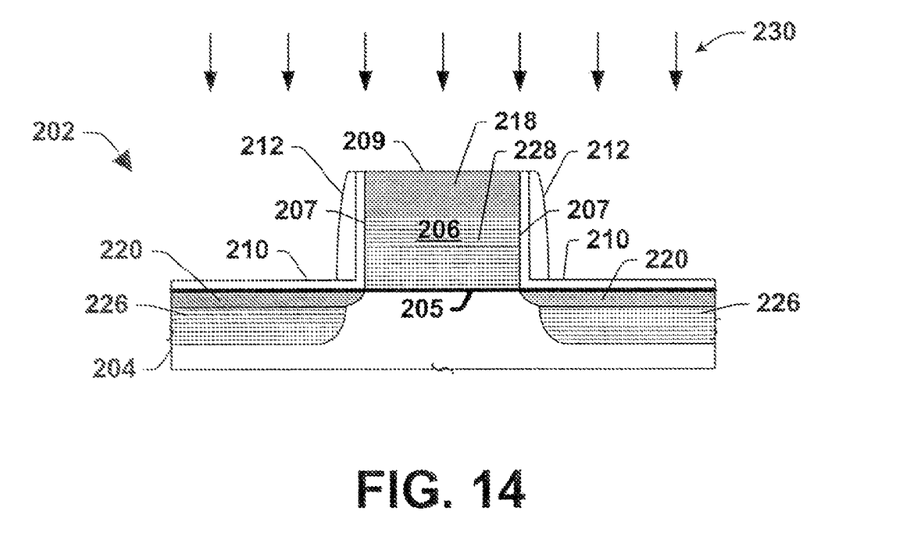
FIG. 14 is a partial side elevation view in section illustrating an annealing process following the source/drain implantation in the device of FIG. 13.

In FIG. 12, an etch process 222 is performed to remove the remaining film 213, which may be any appropriate wet or dry etched. Thereafter in FIG. 13, a source/drain implantation process 224 is employed to provide dopants 226 to deeper portions of the source drain regions of the substrate 204, as well as additional dopants 228 to the gate structure 206. In FIG. 14, a thermal anneal process 230 is performed to diffuse the implanted dopants 218 and 228 further into the polysilicon 206, as well as to diffuse dopants 220 and 226 downward into the substrate 204 to further define the source/drain regions thereof. It will be appreciated that the various regions and features illustrated in the figures are not necessarily drawn to scale, and further that the dopant concentrations in the source/drain regions and the gate structure 206 need not be constant, but rather may be profiled. Thereafter, further interconnection and other back-end processing are performed in a manner known in the art.

Figure 15:
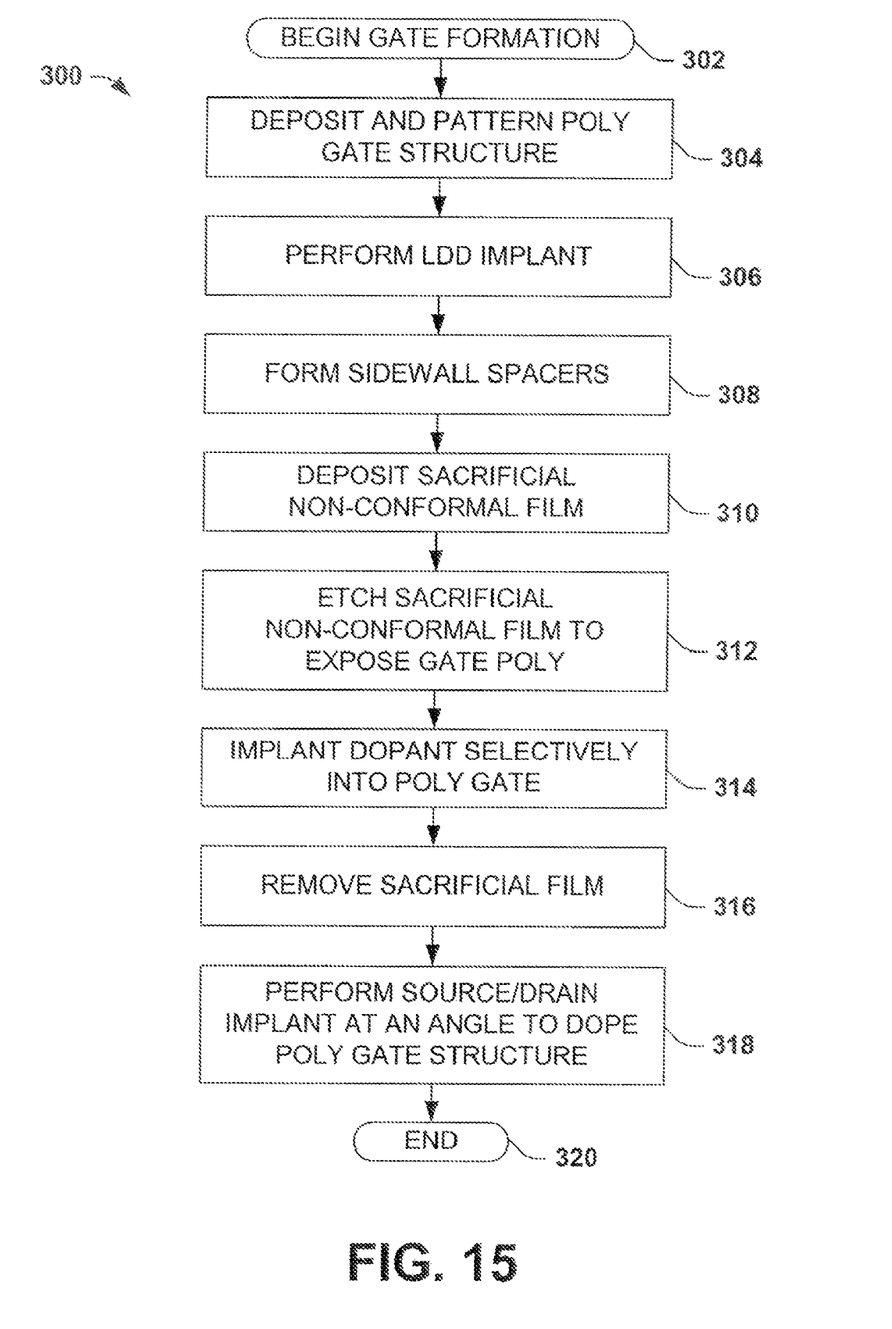
FIG. 15 is a detailed flow diagram illustrating another exemplary method of fabricating semiconductor devices in accordance with the present invention.

Another exemplary implementation of the invention is illustrated in FIGS. 15-21, wherein an implantation mask is formed via substantially non-conformal deposition of a sacrificial film, with etching optionally used to expose the gate structures. FIG. 15 illustrates a method 300 in accordance with this aspect of the invention beginning at 302. At 304, a gate structure is formed by depositing and patterning a polysilicon layer over a wafer substrate. An LDD implant is performed at 306 to implant a shallow portion of the substrate in the source/drain regions using the gate for self-alignment, which may also provide dopants to the gate structure. Sidewall spacers are then formed at 308, for example, by deposition and etching of an oxide or nitride material.

A patterned mask is then formed at 310 and 312, which exposes at least a portion of a gate structure and which covers the remaining upper surfaces of the semiconductor device, before the gate structure or portions thereof are selectively implanted at 314. Unlike the method 100 describe above, however, the method 300 provides for deposition of a substantially non-conformal film at 310, which may optionally be etched back at 312 to expose the gate structures. The non-conformal film preferably has varying thicknesses, wherein the film is thick over the source/drain regions, and thin or non-existent over the gate structures, as illustrated and described with respect to FIGS. 16 and 17 below.

Where the gate structures are exposed (wholly or partially) following the film deposition at 310, a selective gate implant may be performed directly thereafter. Otherwise, an etch is performed at 312, for example, using a reactive ion etch process to remove an upper portion of the film to expose the portion of the gate structure. Any appropriate process and material may be employed for the substantially non-conformal film formation at 310. In one implementation, a spin-on material is used, such as spin-on-glass (SOG). Other materials are possible within the scope of the invention, including photoresist and boro-phospho-silicate glass (BPSG) materials, which may be deposited using any known deposition technique.

At 314, the etched film is used as an implantation mask during selective implantation of dopants into all or some of the gate structure. As with the gate implantation 114 of the method 100 above, the selective gate implantation at 314 in the method 300 may, but need not implant the source/drain or other regions of the substrate. Also, any implantation dosage, energy, species, etc. may be employed at 314 to provide additional dopants to the gate structure in a generally selective fashion. Thereafter, the sacrificial film is removed at 316, such as by wet or dry etching, and a source/drain is performed at 318 to provide further dopants to lower parts of the source/drain regions of the substrate, after which the method 300 ends at 320. It is noted at this point that the ordering of the source/drain and LDD implants may be reversed in the methods 100 and 300, and further that the selective gate implant steps may be performed either with or without the sidewalls spacers being present.

Figure 16:
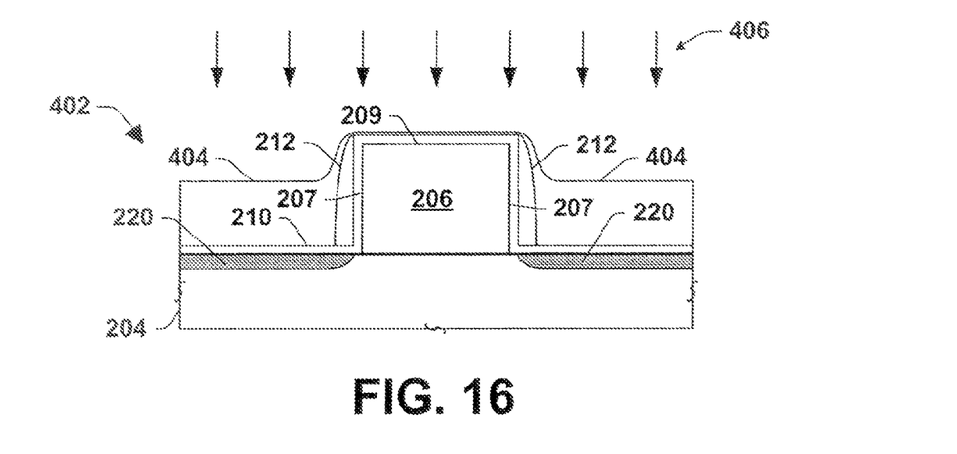
FIG. 16 is a partial side elevation view in section illustrating formation of a sacrificial non-conformal film over another exemplary semiconductor device.
Figure 17:
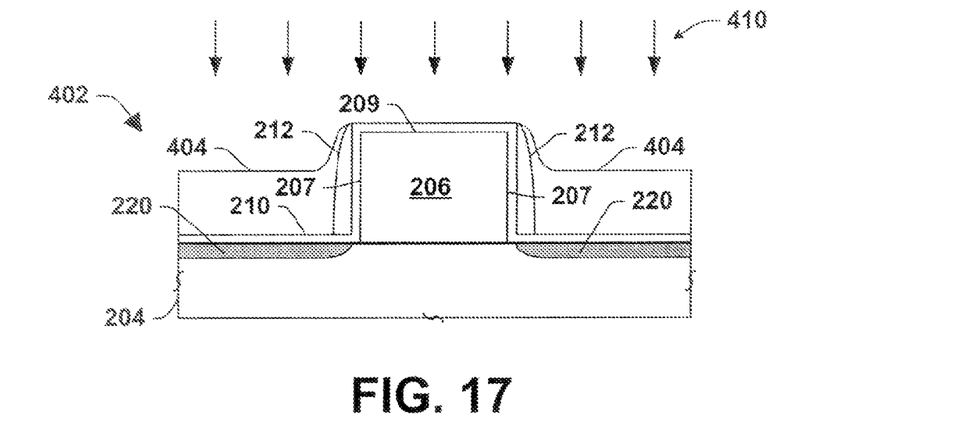
FIG. 17 is a partial side elevation view in section illustrating an etch process to expose the upper surface of a polysilicon gate structure in the device of FIG. 16.
Figure 18:
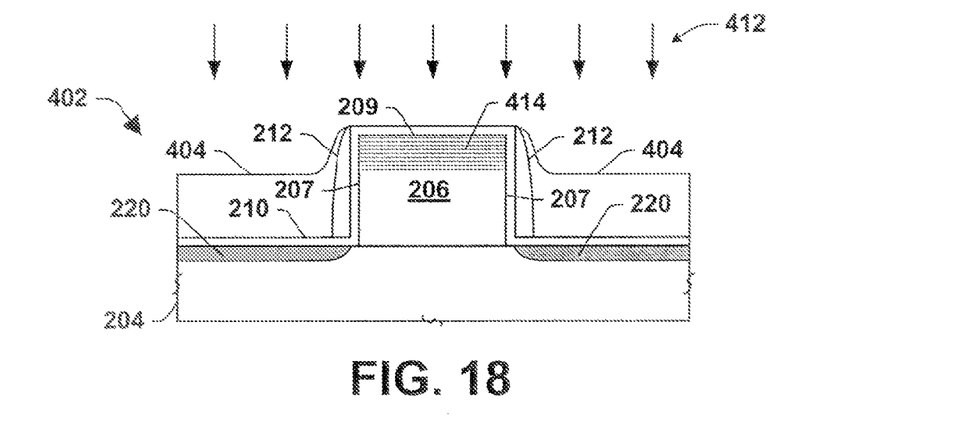
FIG. 18 is a partial side elevation view in section illustrating a selective implantation of dopants into the exposed polysilicon gate structure in accordance with the invention.
Figure 19:
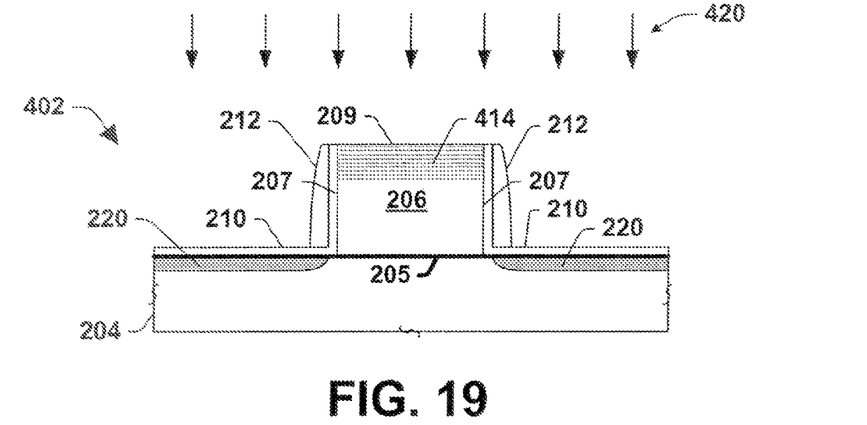
FIG. 19 is a partial side elevation view in section illustrating removal of the remaining sacrificial film from the device of FIG. 18.

FIGS. 16-21 illustrate gate processing according to this aspect of the invention, wherein another exemplary semiconductor device 402 is shown in FIG. 16 after formation and patterning of the gate structure 206, and LDD implantation of dopants 220. A substantially non-conformal film 404 is deposited in FIG. 16 using a deposition process 406. The process 406 may or may not result in a thin layer of the film 404 overlying the gate structure 206, with a relatively thick amount overlying the source/drain regions of the substrate 204. Where the gate structure 206 is wholly or partially exposed, a selective gate implant may be performed as illustrated in FIG. 18. As illustrated in FIG. 16, however, a thin film 404 may exist over the gate 206, which is then removed by an etch process 410 in FIG. 17. Any appropriate etch process 410 may be used in accordance with the invention, such as a reactive ion etch process which exposes some or all of the gate structure 206.

Figure 20:
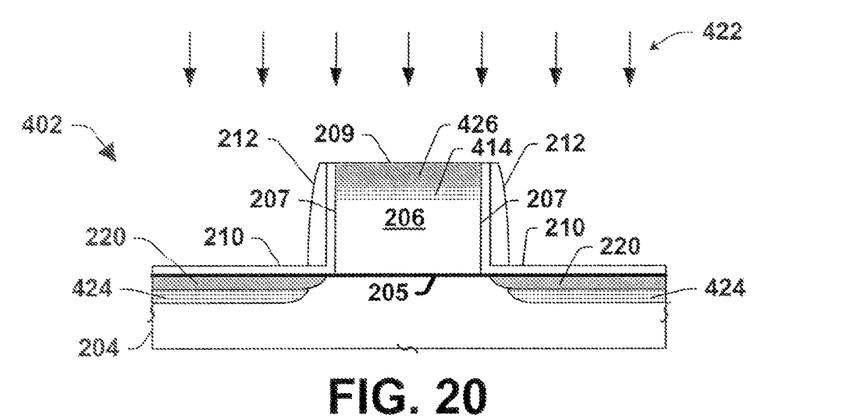
FIG. 20 is a partial side elevation view in section illustrating a source/drain implantation in the device of FIG. 19.
Figure 21:
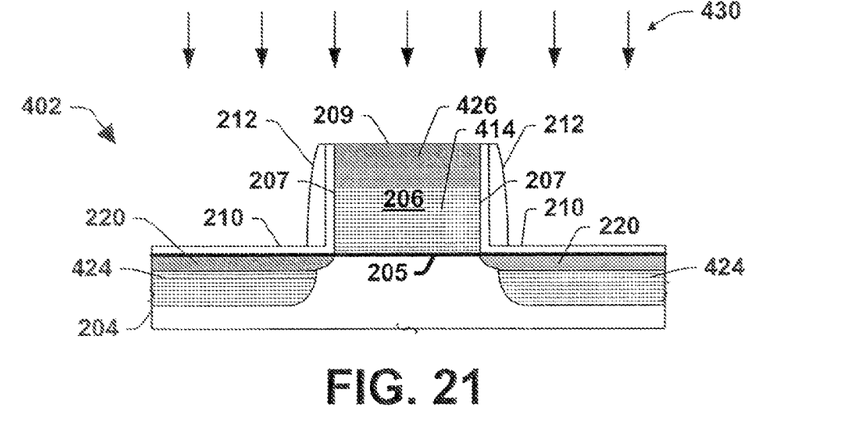
FIG. 21 is a partial side elevation view in section illustrating an annealing process following the source/drain implantation in the device of FIG. 20.

In either case, a selective implantation process 412 is employed in FIG. 18 to provide additional dopants 414 to the gate structure in a generally selective fashion, whereby few or no dopants are provided to the source/drain regions of the substrate 204. Like the other exemplary implementations illustrated and described above, the film 404 operates in FIG. 19 as an implantation mask to allow or facilitate provision of additional dopants to the gate structure 206 to compensate for subsequent gate dopant depletion. The sacrificial film is then removed in FIG. 19 using a wet or dry etch process 420. In FIG. 20, a source/drain implantation process 422 is performed, providing further dopants 424 to lower parts of the source/drain regions of the substrate and dopants 426 to the gate structure 206. Thereafter an anneal operation 430 is employed in FIG. 21 to drive implanted dopants 424/220 and 426/414 further into the wafer substrate 204 and the gate structure 206, respectively.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementation of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of fabricating a semiconductor device, comprising:
   forming a gate structure over a semiconductor substrate;
   performing an LDD implant;
   after performing the LDD implant, forming an implant mask over a semiconductor device by spinning on a SOG (spin-on glass) material over the semiconductor substrate, the implant mask exposing at least a portion of a gate structure and covering remaining upper surfaces of the semiconductor device;
   selectively implanting dopants into an exposed portion of the gate structure;
   removing the implant mask; and
   after removing the implant mask, performing a source/drain implant.

2. The method of claim 1, further comprising the step of forming sidewall spacers adjacent the gate structure after performing the LDD implant and prior to forming the implant mask.

3. The method of claim 1, wherein the step of forming the implant mask further comprises etching the spin-on glass material to expose a portion of the gate structure.

4. The method of claim 3, wherein said etching comprises reactive ion etching.

5. A method of fabricating a semiconductor device, comprising:
   forming a gate structure over a semiconductor substrate;
   performing an LDD implant;
   forming sidewall spacers adjacent the gate structure;
   after forming the sidewall spacers, forming an implant mask over a semiconductor device by depositing a substantially non-conformal film over the semiconductor substrate, the implant mask exposing at least a portion of a gate structure and covering remaining upper surfaces of the semiconductor device;
   selectively implanting dopants into an exposed portion of the gate structure;
   removing the implant mask; and
   after removing the implant mask, performing a source/drain implant.

6. The method of claim 5, wherein said substantially non-conformal film comprises a spin-on-glass material.

7. The method of claim 5, wherein the step of forming the implant mask further comprises etching the substantially non-conformal film to expose a portion of the gate structure.

8. The method of claim 7, wherein said etching comprises reactive ion etching.

9. A method of fabricating a semiconductor device, comprising:
   forming a gate structure over a semiconductor substrate
   forming an implant mask over the semiconductor substrate by depositing a substantially non-conformal film, wherein the substantially non-conformal film has an as—deposited thickness over a prospective source/drain region that is less than a thickness of the gate structure, the implant mask exposing at least a portion of a gate structure and covering remaining upper surfaces of the semiconductor device;

selectively implanting dopants into an exposed portion of the gate structure; and removing the implant mask.

10. The method of claim 9 further comprising the steps of: performing an LDD implant prior to forming the implant mask; and performing a source/drain implant after removing the implant mask.

11. The method of claim 10, further comprising the step of form sidewall spacers adjacent the gate structure after performing the LDD implant and prior to forming the implant mask.

12. The method of claim 9, wherein the substantially non-conformal film comprises depositing one of a photoresist, an SOG material, and a BPSG material.

13. The method of claim 9, wherein the step of forming the implant mask further comprises etching the substantially non-conformal film to expose a portion of the gate structure.

14. The method of claim 13, wherein said etching comprises reactive ion etching.

15. The method of claim 9, wherein the substantially non-conformal film at least partially exposes the gate structure as deposited.

16. The method of claim 5, wherein the substantially non-conformal film at least partially exposes the gate structure as deposited.

17. The method of claim 1, wherein the SOG material at least partially exposes the gate structure as deposited.

\* \* \* \* \*

UNITED STATES PATENT AND TRADEMARK OFFICE
CERTIFICATE OF CORRECTION

PATENT NO. : 7,572,693 B2
APPLICATION NO. : 11/462541
DATED : August 11, 2009
INVENTOR(S) : Johnson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 161 days.

Signed and Sealed this

Seventh Day of September, 2010

David J. Kappos
*Director of the United States Patent and Trademark Office*